US012794489B2

(12) United States Patent
Javvaji et al.

(10) Patent No.: US 12,794,489 B2
(45) Date of Patent: Nov. 10, 2026

(54) NOISE TRANSFER FUNCTION SYNTHESIS FOR HIGHER-ORDER MODULATORS

(71) Applicant: NXP B.V., Eindhoven (NL)

(72) Inventors: Sundeep Lakshmana Javvaji, Delft (NL); Muhammed Bolatkale, Delft (NL); Shagun Bajoria, Eindhoven (NL); Lucien Johannes Breems, Waalre (NL); Kofi Afolabi Anthony Makinwa, Delft (NL)

(73) Assignee: NXP B.V., Eindhoven (NL)

( * ) Notice: Subject to any disclaimer, the term of this patent is extended or adjusted under 35 U.S.C. 154(b) by 94 days.

(21) Appl. No.: 18/824,443

(22) Filed: Sep. 4, 2024

(65) Prior Publication Data

US 2026/0066921 A1 Mar. 5, 2026

(51) Int. Cl.
*H03M 3/00* (2006.01)
*H03M 7/32* (2006.01)
*H03M 7/36* (2006.01)

(52) U.S. Cl.
CPC ....... *H03M 7/3042* (2013.01); *H03M 7/3026* (2013.01)

(58) Field of Classification Search
CPC ............. H03M 1/3024; H03M 7/3026; H03M 7/3031; H03M 7/3033; H03M 7/3037; H03M 7/3024
USPC ......................................... 341/143, 155, 144
See application file for complete search history.

(56) References Cited

U.S. PATENT DOCUMENTS

| | | | | |
|---|---|---|---|---|
| 5,055,843 A * | 10/1991 | Ferguson, Jr. | ........... | H03G 3/02 375/247 |
| 6,420,987 B1 * | 7/2002 | Schoner | ................ | H03M 3/352 341/143 |
| 6,888,484 B2 | 5/2005 | Kiss et al. | | |
| 7,110,460 B1 * | 9/2006 | Melanson | ............. | H03M 7/304 375/247 |
| 8,552,894 B2 * | 10/2013 | Huang | .................. | H03M 3/438 375/370 |

(Continued)

OTHER PUBLICATIONS

Balagopal, Sakkarapani et al.; "A 1 GS/s, 31 MHz BW, 76.3 dB dynamic range, 34 mW CT-ΔΣ ADC with 1.5 cycle quantizer delay and improved STF"; Analog Integrated Circuits and Signal Processing, vol. 78, Issue 2, pp. 275-286; Published: Feb. 1, 2014; https://doi.org/10.1007/s10470-013-0066-2.

(Continued)

*Primary Examiner* — Peguy Jean Pierre

(57) ABSTRACT

Embodiments of circuits and methods are described below that may provide a modulator that has an enhanced signal-to-quantization-noise ratio (SQNR) for a given sampling frequency and bandwidth or that may enable a reduced sampling frequency for a target SQNR and bandwidth. In one or more embodiments, a modulator circuit may include a first modulator including an input and a first output, and including one or more feed-forward components; an output circuit including an input coupled to the first output and including an output, the output circuit including one of a noise-shaping circuit, a noise-shaped quantizer circuit, or an integrator and feed-forward component; and coefficients of the one or more feed-forward components of the first modulator and a transfer function of the output circuit provide a higher-order modulator with a first-order roll-off at high out-of-band frequencies.

17 Claims, 8 Drawing Sheets

(56) References Cited

U.S. PATENT DOCUMENTS

| | | | | |
|---|---|---|---|---|
| 9,564,916 | B2 * | 2/2017 | Bandyopadhyay | H03M 3/352 |
| 10,277,241 | B1 * | 4/2019 | Rajaee | H03M 3/37 |
| 2011/0012766 | A1 * | 1/2011 | Van Veldhoven | H03M 7/302<br>332/115 |

OTHER PUBLICATIONS

He, Lin et al.; "Digital Noise-Coupling Technique for Delta-Sigma Modulators With Segmented Quantization"; IEEE Transactions on Circuits and Systems II: Express Briefs ( vol. 61, Issue: 6, Jun. 2014) ; Published Apr. 24, 2014, pp. 403-407; DOI: 10.1109/TCSII.2014.2319994.

Meng Xin et al.; "Low-Distortion Wideband Delta-Sigma ADCs With Shifted Loop Delays"; IEEE Transactions on Circuits and Systems I: Regular Papers ( vol. 62, Issue: 2, Feb. 2015) pp. 376-384; Date of Publication: Oct. 29, 2014; DOI: 10.1109/TCSI.2014.2362972.

Wang, Yan et al.; "Noise-coupled Continuous-Time ΔΣ ADCs", Midwest Symposium on Circuits and Systems; Aug. 2-5, 2009, Cancun, Mexico; pp. 341-344.

Kiss et al., "Stable high-order delta-sigma digital-to-analog converters," in IEEE Transactions on Circuits and Systems I: Regular Papers, vol. 51, No. 1, pp. 200-205, Jan. 2004, doi: 10.1109/TCSI.2003.821283.

Pavan et al., "Understanding Delta-Sigma Data Converters," 2017, book abstract only included, 4 pages.

* cited by examiner

500

NOISE TRANSFER FUNCTION SYNTHESIS FOR HIGHER-ORDER MODULATORS

FIELD OF USE

The present disclosure generally relates to signal modulators, and more particularly, to systems and methods of determining and synthesizing a noise transfer function for higher-order discrete-time or continuous-time modulators, such as a fifth-order delta-sigma modulator.

BACKGROUND

Delta-sigma modulation techniques have been widely used in moderate and high accuracy analog/mixed-signal IC applications, such as analog-to-digital data converters (ADCs), digital-to-analog data converters (DACs), frequency synthesis, and power amplification. Continuous-time delta-sigma modulators (CTDSMs) are widely used to achieve the high linearity requirements (<–100 dBFS) intended for high quality radio and car radar applications. One of the factors that contributes to the signal-to-noise ratio (SNR) for CTDSMs is its order of the loop filter.

CTDSMs may utilize gigahertz sampling frequencies to achieve bandwidths greater than a few tens of megahertz and may use higher-order (greater than 4) loop filters to aggressively shape the in-band quantization noise. Performance of such higher order CTDSMs may be restricted by stability of the feedback loop.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures and in the detailed description indicates similar or identical items or features.

Figure 1:
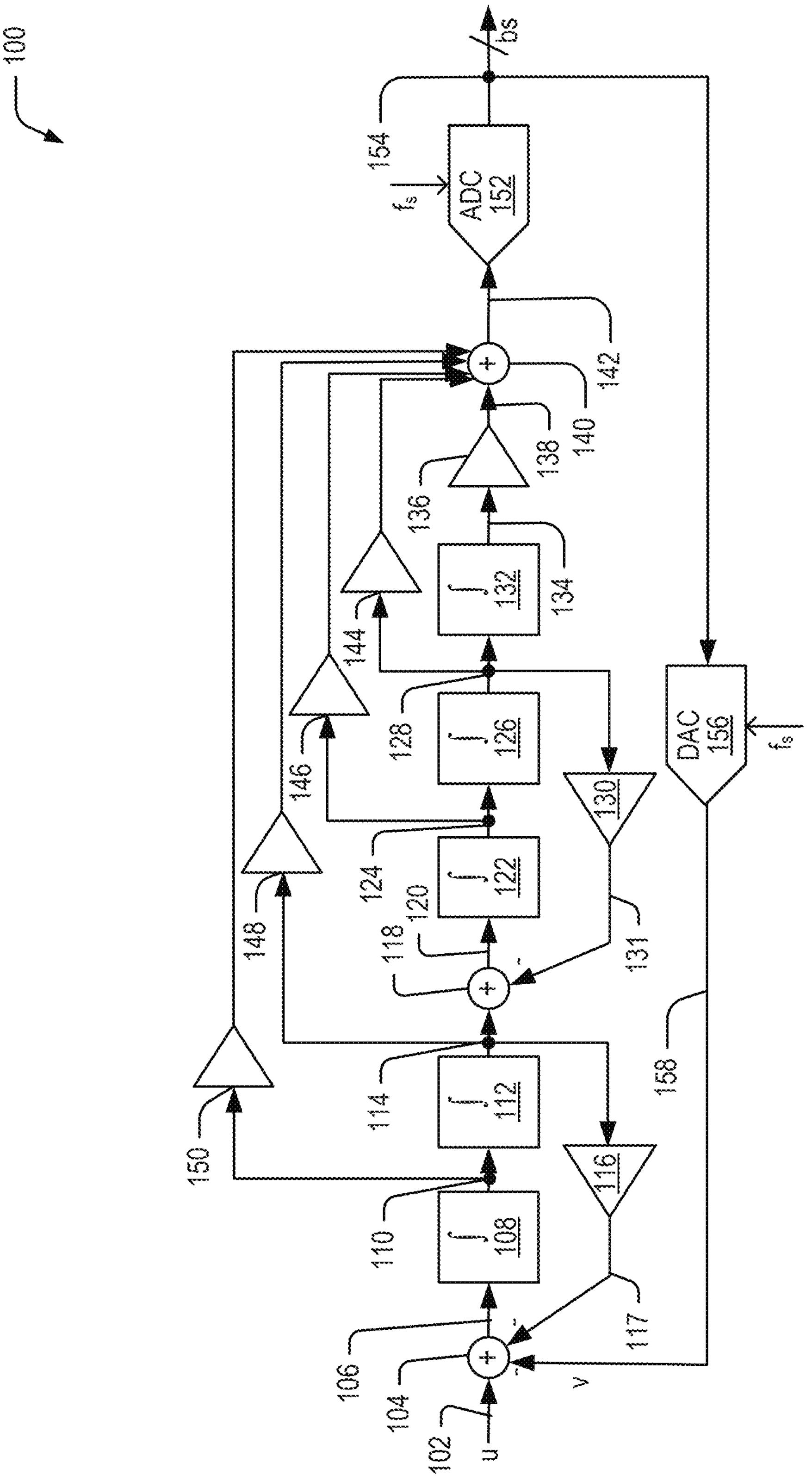
FIG. 1 depicts a block diagram of an embodiment fifth-order CTDSM including a cascade of integrators with a feed-forward (CIFF) loop filter.

While implementations are described in this disclosure by way of example, those skilled in the art will recognize that the implementations are not limited to the examples or figures described. Rather, the figures and detailed description thereto are not intended to limit implementations to the form disclosed, but instead the intention is to cover all modifications, equivalents, and alternatives falling within the spirit and scope as defined by the appended claims. The headings used in this disclosure are for organizational purposes only and are not meant to limit the scope of the description or the claims. As used throughout this application, the word "may" is used in a permissive sense (in other words, the term "may" is intended to mean "having the potential to") instead of in a mandatory sense (as in "must"). Similarly, the terms "include," "including," and "includes" mean "including, but not limited to."

DETAILED DESCRIPTION

Higher-order CTDSMs having multiple (greater than 4) integrators may be utilized to aggressively shape in-band quantization noise. Such CTDSMs may be designed by determining the loop filter transfer functions, which is conventionally determined by mapping Butterworth, Chebyshev, or inverse Chebyshev filter transfers functions. Such transfer filters may exhibit flat out-of-band quantization noise. Embodiments of methods and systems are described below that synthesize the noise transfer function with a roll-off at high (out-of-band) frequencies to produce a modulator of any order that has a first-order roll-off at high (out-of-band) frequencies.

Embodiments of circuits and methods are described below that may provide a modulator, such as a delta-sigma modulator, that has an enhanced signal-to-quantization-noise ratio (SQNR) for a given sampling frequency and bandwidth or that may enable a reduced sampling frequency for a target SQNR and bandwidth. In one or more embodiments, a delta-sigma modulator may include a fourth-order cascade of integrators with feed-forward (CIFF) loop filter including an input and a first output, the CIFF loop filter including a plurality of feed-forward components; an output circuit including an input coupled to the first output and including an output, the output circuit; including one of a noise-shaping circuit, a noise-shaped quantizer circuit, or a fifth integrator and feed-forward component; and the fourth-order CIFF loop filter and the output circuit provide a fifth order delta-sigma modulator with a first-order roll-off at high out-of-band frequencies.

In one or more embodiments, a modulator of any order may be configured to have a noise transfer function with a first-order roll-off at high frequencies (e.g., the sampling frequency divided by two ($f_s/2$)), providing a higher-order modulator. For example, a second-order modulator may be designed to provide a first-order roll-off at high frequencies, which provides a third-order modulator. While the following examples are directed to higher-order delta-sigma modulators (i.e., with four or more integrators), it should be understood that the fourth-order loop filters and the CIFF implementations represent particular embodiments that are provided for illustrative, non-limiting purposes. The design methodologies described herein may be utilized with any order of loop filter or modulator. The noise transfer function roll-off is first order at high frequencies ($f_s/2$) instead of at zero-order. The noise transfer function roll-off may be designed and implemented for any order loop filter or modulator, for continuous-time implementations, or for discrete time implementations.

The following discussion includes various implementations of loop filter architectures. It should be appreciated that the methodology may be applied to other types of loop filters architectures (such as a cascaded integrator-comb (CIC), finite response filters, or other filters) to provide first-order roll-off at high frequencies.

FIG. 1 depicts a block diagram of an embodiment fifth-order CTDSM 100 including a cascade of integrators 108, 112, 122, 126, and 132 with a feed-forward (CIFF) loop filter. The CTDSM 100 may include an input 102 to receive a signal u. The input 102 may be coupled to a first input of a summing node 104, which may include a second input coupled to a node 158 to receive feedback, a third input coupled to a node 117, and an output coupled to a node 106.

The CTDSM 100 may include a first integrator 108 including an input coupled to the node 106 and an output coupled to a node 110. The CTDSM 100 may include a second integrator 112 including an input coupled to the node 110 and an output coupled to a node 114, which may be coupled to a first input of a summing node 118. The summing node 118 may include a second input coupled to a node 131 and an output coupled to a node 120. The first integrator 108 and the second integrator 112 may form a resonator in conjunction with a feedback component 116, which may be a resistor, an amplifier, or another component including an input coupled to the node 114 and an output coupled to the node 117, which is coupled to the third input of the summing node 104.

The CTDSM 100 may include a third integrator 122 including an input coupled to the node 120 and an output coupled to the node 124. The CTDSM 100 may include a fourth integrator 126 including an input coupled to the node 124 and an output coupled to the node 128. The third integrator 122 and the fourth integrator 126 may form a second resonator in conjunction with a feedback component 130, which may include an input coupled to the node 128 and an output coupled to the node 131 that is coupled to the second input of the summing node 118.

The CTDSM 100 may include a fifth integrator 132 including an input coupled to the node 128 and an output coupled to a node 134. The CTDSM 100 may include a feed-forward component 136 including an input coupled to the node 134 and an output coupled to the node 138, which may be coupled to a first input of a summing node 140. The CTDSM 100 may include a feed-forward component 144 including an input coupled to the node 128 and an output coupled to a second input of the summing node 140. The CTDSM 100 may include a feed-forward component 146 including an input coupled to the node 124 and an output coupled to a third input of the summing node 140. The CTDSM 100 may include a feed-forward component 148 including an input coupled to the node 114 and an output coupled to a fourth input of the summing node 140. The CTDSM 100 may include a feed-forward component 150 including an input coupled to the node 110 and an output coupled to a fifth input of the summing node 140.

The summing node 140 may include an output coupled to a node 142. The CTDSM 100 may include an analog-to-digital converter (ADC) 152 including a first input coupled to the node 142, a second input to receive a sampling frequency signal $f_s$, and an output coupled to the node 154, which may provide an output signal. The CTDSM 100 may include a digital-to-analog converter (DAC) 156 including a first input coupled to the node 154, a second input to receive the sampling frequency signal $f_s$, and an output coupled to the node 158, which is coupled to the second input of the summing node 104.

The feed-forward components 150, 148, 146, 144, and 136 may introduce feed-forward coefficients C1, C2, C3, C4, and C5, respectively. In one or more embodiments, the unity gain frequencies of the integrators 108, 112, 122, 126, and 132 are ω1, ω2, ω3, ω4, and ω5, respectively. To optimize the in-band quantization noise, the loop filter may include two resonators. The first resonator may include integrators 108 and 112 and feedback component 116, which is realized using a coefficient d1. The second resonator may include integrators 122 and 126 and feedback component 130, which may be realized using the coefficient d2. The feedback coefficients d1 and d2 for the feedback components 116 and 130 may be determined based on a selected frequency response for each of the resonators.

In one or more embodiments, the CTDSM 100 is a fifth-order modulator designed for a bandwidth of 120 MHz with an over-sampling ratio (OSR) of 25, which results in a sampling frequency of 6 gigahertz (GHz). The coefficients C1, C2, C3, C4, and C5 may be synthesized using a delta-sigma toolbox in a mathematical tool, such as Matlab, by using Butterworth, Chebyshev, or inverse Chebyshev filters, all of which exhibit a flat out-of-band power spectral density (PSD) at high frequencies (frequencies above the bandwidth of interest). An example plot of the power spectral density of the CTDSM 100 is shown in FIG. 2.

Figure 2:
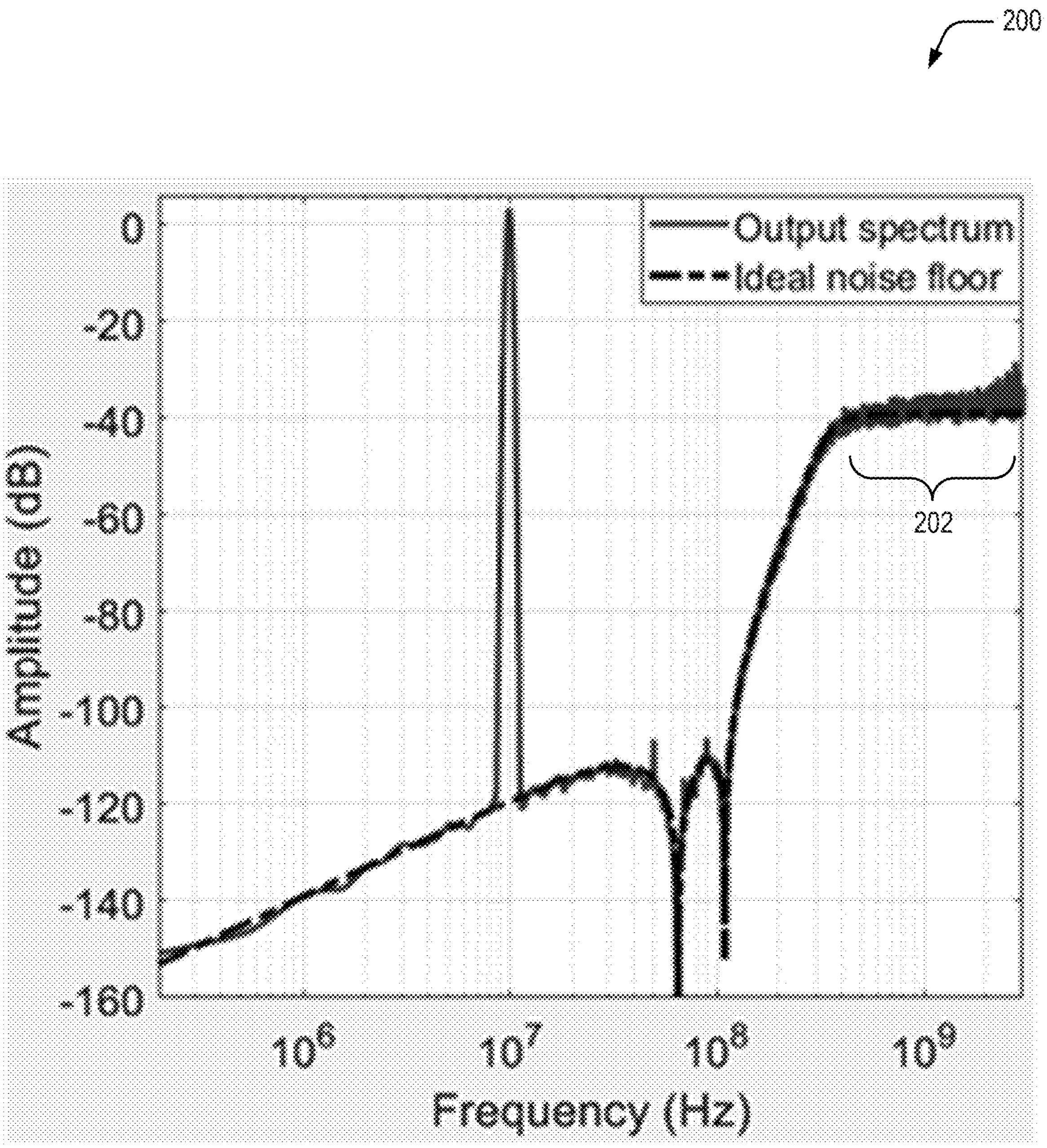
FIG. 2 depicts a graph of the power spectral density of the CTDSM of FIG. 1 showing a relatively flat out-of-band PSD at high frequencies.

FIG. 2 depicts a graph 200 of the power spectral density of the CTDSM 100 of FIG. 1 showing a relatively flat out-of-band PSD at high frequencies, which is generally indicated at 202. In the graph 200, at a maximum stable amplitude (MSA) of 0.65 volts (V) and a frequency of 10 megahertz (MHz), the CTDSM 100 achieves a peak signal-to-quantization-noise ratio (SQNR) of 93.3 decibels (dB) in the 120 MHz bandwidth. Outside of the bandwidth of interest, the CTDSM 100 may exhibit a flat out-of-band noise transfer function (i.e., flat out-of-band quantization noise).

In general, the maximum achievable bandwidth of the CTDSM 100 may be limited by the maximum sampling frequency for a target SQNR. As described below with respect to FIGS. 3-8, a CTDSM may be configured to significantly improve the in-band SQNR for a given sampling frequency $f_s$ and bandwidth or to reduce the sampling frequency $f_s$ for a target SQNR and bandwidth by designing the CTDSM to provide first-order roll-off in the noise-transfer function.

Figure 3:
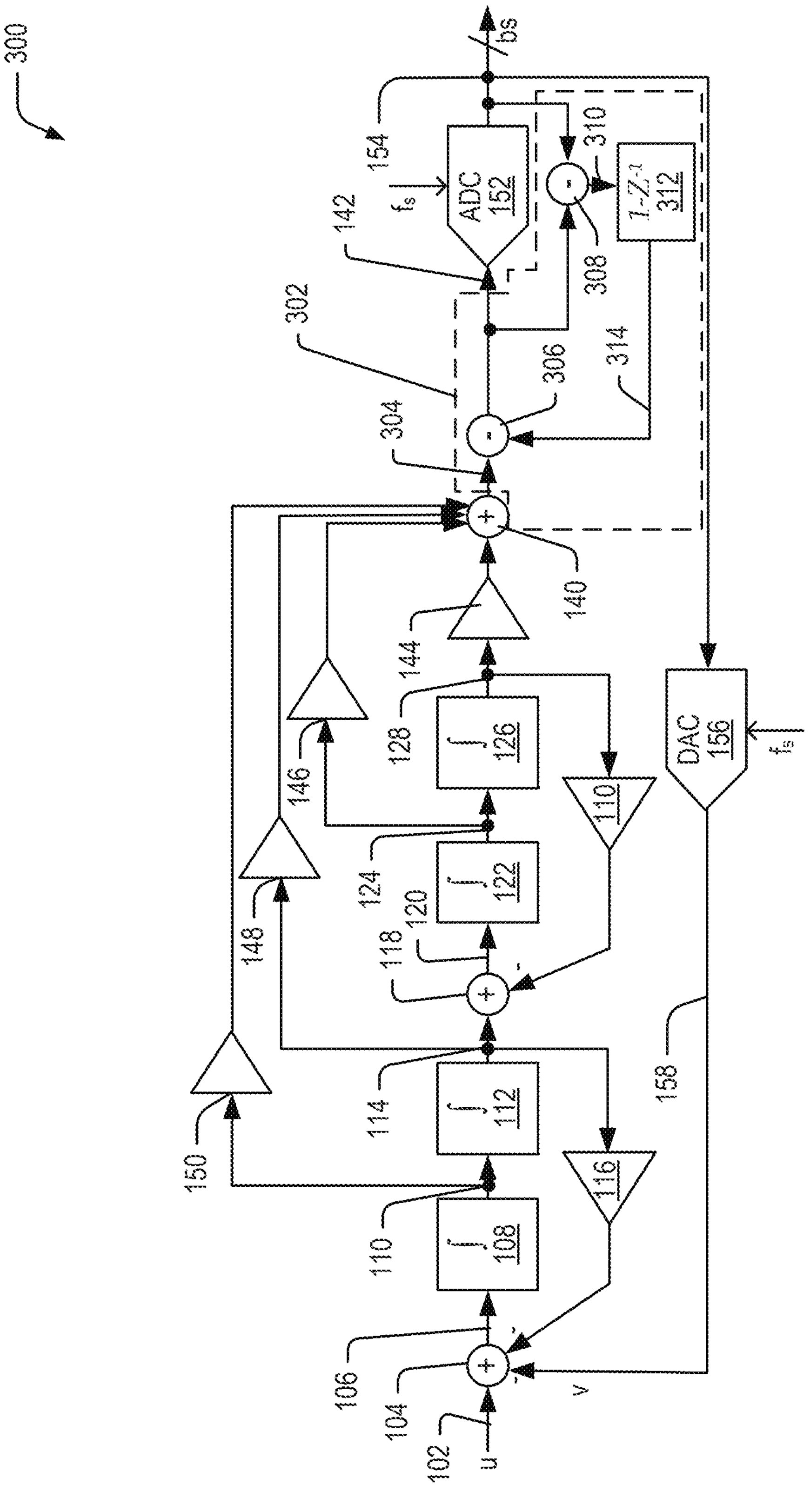
FIG. 3 depicts a fifth-order cascade of integrators with feed-forward (CIFF) loop filter implementing a CTDSM with first order roll-off at high frequencies, in accordance with certain embodiments.

FIG. 3 depicts a fourth-order cascade of integrators with feed-forward (CIFF) loop filter 300 cascaded with a first-order noise-shaped ADC 152, providing a first order roll-off at high frequencies, in accordance with certain embodiments. The CIFF loop filter 300 may include all the elements of the CTDSM 100 of FIG. 1, except that the fifth integrator 132, the feed-forward component 136, and nodes 134 and 136 are omitted. The node 128 is coupled to the first input of the summing node 140.

Noise-shaping of the ADC 152 may be provided by a noise-shaping circuit 302, generally indicated by a dashed outline shape. In one or more embodiments, the ADC 152 may be understood to be a quantizer. The noise-shaping circuit 302 may include a first node 304 coupled to an output of the summing node 140. The noise-shaping circuit 302 may include a summing node 306 including a first input coupled to the node 304, a second input coupled to a node 314 and an output coupled to the node 142, which is coupled to the input of the ADC 152. The noise-shaping circuit 302 may include a summing node 308 including a first input coupled to the node 154, a second input coupled to the node 142, and an output coupled to the node 310 to provide a difference value to an input of a noise transfer function 312. The transfer function 312 may include an output coupled to the node 314, which is coupled to the second input of the summing node 306.

In the illustrated example, the summing nodes 306 and 308 may be configured to subtract their input values to produce a difference value at their outputs. In one or more embodiments, the fourth-order loop filter 300 may be synthesized using the delta-sigma toolbox of a mathematical tool, such as Matlab or another circuit modeling software, using either Butterworth filters, Chebyshev filters, or inverse Chebyshev filters. In one or more embodiments, the noise-shaping of the ADC 152 may be realized using the noise-shaping circuit 302 including the noise transfer function 312 to provide a first-order roll-off at high frequencies, such as frequencies above a bandwidth of interest.

Figure 4:
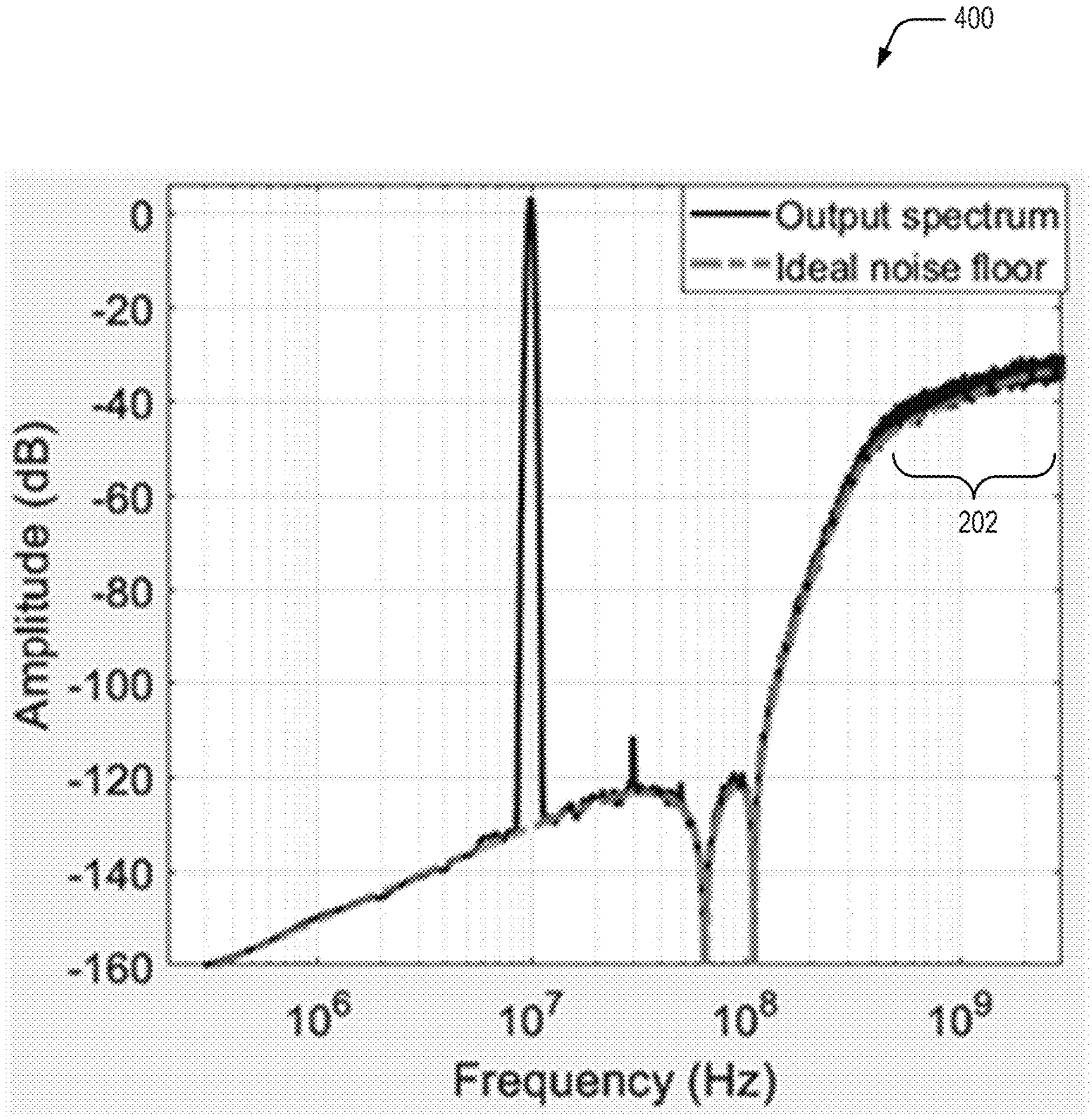
FIG. 4 depicts a graph of the power spectral density of the CTDSM of FIG. 3 showing a first-order roll-off at high frequencies, in accordance with certain embodiments.

FIG. 4 depicts a graph 400 of the power spectral density of the CTDSM of FIG. 3 showing a first-order roll-off at high frequencies, in accordance with certain embodiments. Assuming a MSA of 0.65 V and a frequency of 10 MHz, the loop filter 300 may provide a modulator that achieves a peak SQNR of 102.3 dB in the 120 MHz bandwidth of interest. This peak SQNR is 9 dB higher than the modulator 100 in FIG. 1 as shown in the graph 200 of FIG. 2.

In the graph 400, a tone is shown at about 10 MHz. The first-order roll-off is generally indicated at 402. By adjusting the transfer function 312 in FIG. 3, the in-band SQNR can be tuned to provide the first-order roll-off at selected frequencies. In one or more embodiments, the transfer function 312 may be determined to improve the SQNR for a given sampling frequency and bandwidth. In one or more embodiments, the transfer function 312 may be determined to enable reduction of the sampling frequency for a target SQNR and bandwidth.

Figure 5:
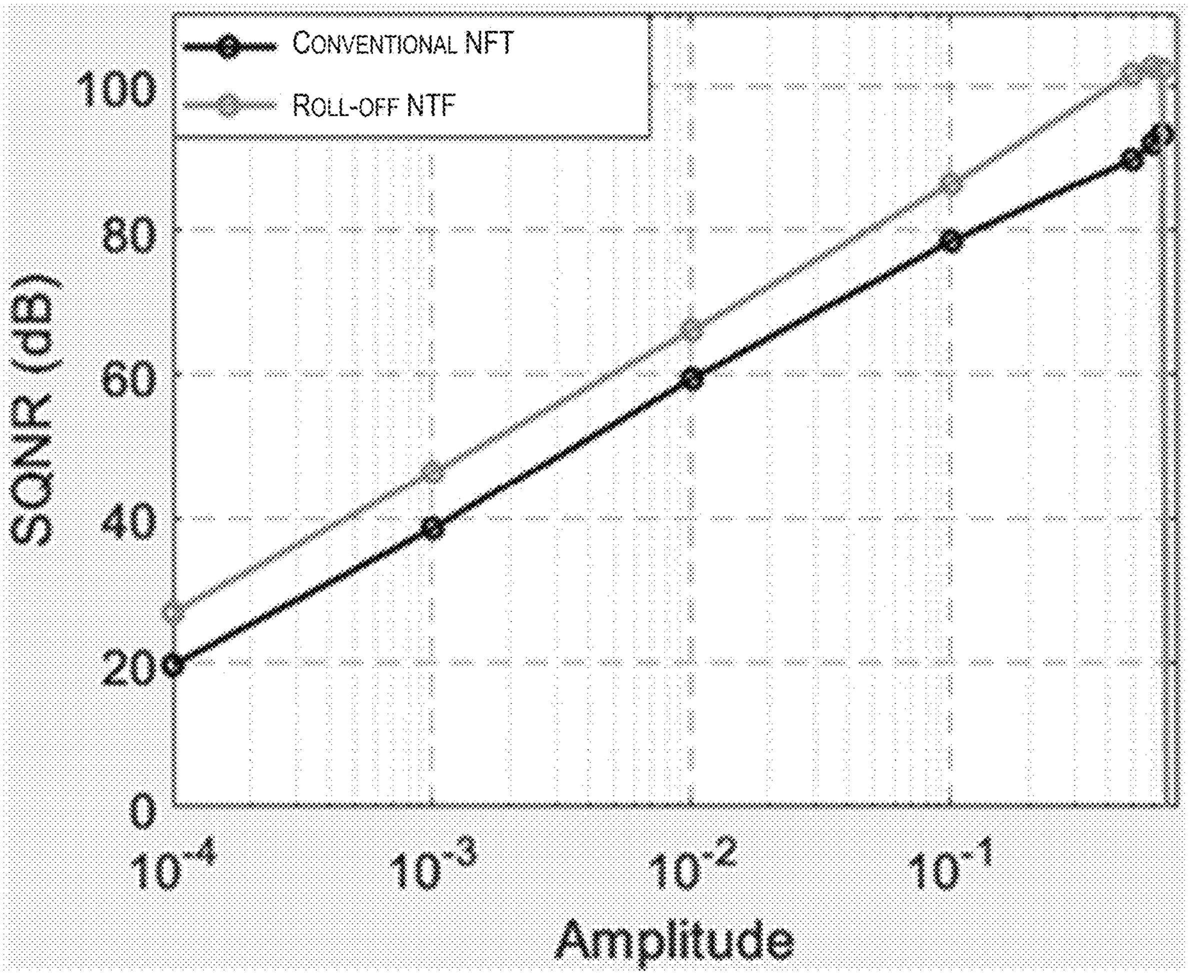
FIG. 5 depicts a graph of a plot of the signal-to-quantization-noise (SQNR) versus input amplitude for the noise transfer function of the CTDSM of FIG. 1 and the CTDSM of FIG. 3, in accordance with certain embodiments.

FIG. 5 depicts a graph 500 of a plot of the signal-to-quantization-noise (SQNR) versus input amplitude for the noise transfer function of the CTDSM 100 of FIG. 1 and the loop filter 300 of FIG. 3, in accordance with certain embodiments. For the illustrated graph, both the CTDSM 100 and the loop filter 300 were designed for the same MSA. The loop filter 300 with the first-order roll-off achieves an SQNR that is 9 dB higher than the CTDSM 100.

In the illustrated embodiment of FIG. 3, the final integrator is implemented in discrete time. The loop filter 300 with the first-order roll-off may be implemented as a CTDSM by matching sampled pulse responses as described below with respect to FIGS. 6A and 6B.

Figure 6A:
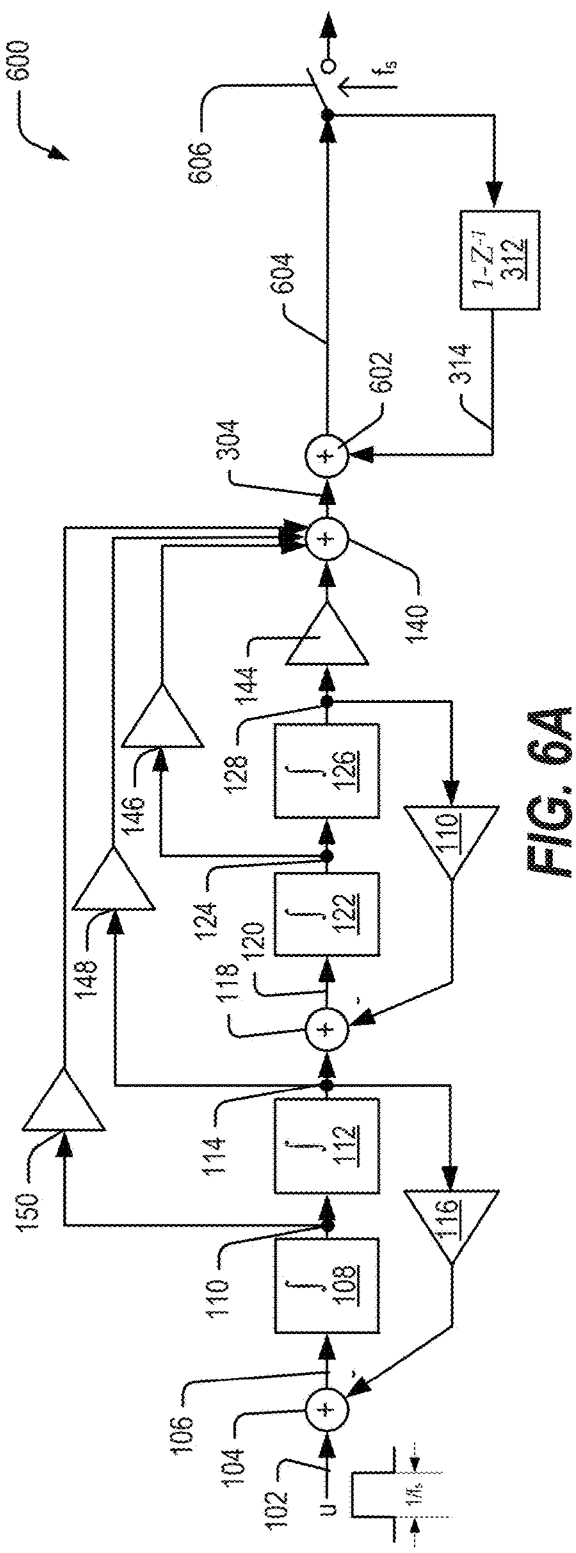
FIG. 6A depicts a block diagram of a hybrid loop filter used to determine a sampled pulse response, in accordance with certain embodiments.

FIG. 6A depicts a block diagram of a hybrid loop filter 600 used to determine a sampled pulse response, in accordance with certain embodiments. The hybrid loop filter 600 may include all the elements of the loop filter 300 of FIG. 3, except that the summing nodes 306 and 310 and the ADC 152 are omitted. The hybrid loop filter 600 may include a summing node 602 including a first input coupled to the node 304, a second input coupled to the node 314, and an output coupled to a node 604. The node 604 may be coupled to a first terminal of a switch 606, which has a second terminal to provide an output signal and a control input to receive a sampling frequency signal $f_s$. The transfer function 312 may be coupled between the node 604 and the node 314.

In one or more embodiments, the hybrid loop filter 600 may be designed using the delta-sigma toolbox of a mathematical modeling program, such as Matlab or other modeling software, with one of the existing filters, such as a Butterworth filter, a Chebyshev filter, or an inverse Chebyshev filter. Based on the chosen filter, the coefficients C1, C2, C3, and C4 may be determined for the feed-forward components 150, 148, 146, and 144, respectively. Using these coefficients, a pulse may be provided to the input 102, and a sampled pulse response may be determined for the hybrid loop filter 600.

Figure 6B:
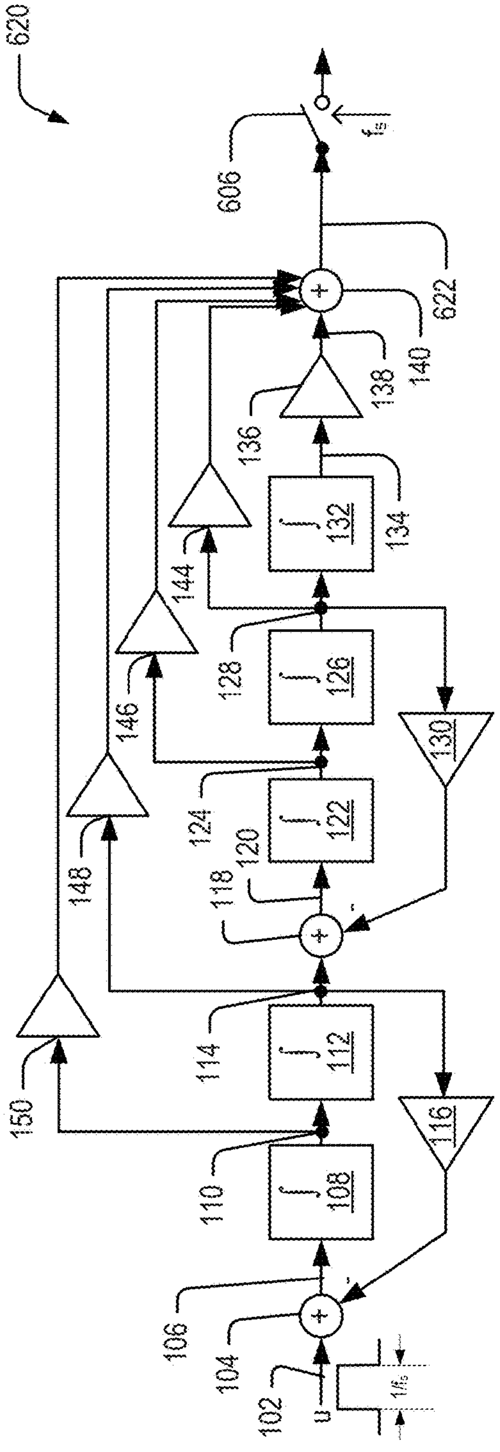
FIG. 6B depicts a block diagram of a fifth-order CTDSM having coefficients determined by matching its sampled pulse response to the sampled pulse response of the hybrid loop filter of FIG. 6A, in accordance with certain embodiments.

FIG. 6B depicts a block diagram of a fifth-order CTDSM 620 having coefficients determined by matching its sampled pulse response to the sampled pulse response of the hybrid loop filter 600 of FIG. 6A, in accordance with certain embodiments. The CTDSM 620 may include all the elements of the CTDSM 100 of FIG. 1, except that the ADC 152 is omitted. The CTDSM 620 may include the switch 606 including a first terminal coupled to the node 142, a second input to receive a sampling frequency signal $f_s$, and an output terminal to provide an output signal.

To determine the coefficients C1, C2, C3, C4, and C5 for the feed-forward components 150, 148, 146, 144, and 136, respectively, an input signal may be applied to the input 102 of the CTDSM 620 and the sampled pulse response may be determined at the output of the switch 606 of the CTDSM 620. The coefficients C1, C2, C3, C4, and C5 of the feed-forward components 150, 148, 146, 144, and 136 may be determined by configuring one or more of the coefficients to match the sampled pulse response of the CTDSM 620 to the sampled pulse response of the hybrid loop filter 600. These determined coefficients C1, C2, C3, C4, and C5 may be synthesized using mathematical modeling software to produce a CTDSM 620 with first-order roll-off at high frequencies, which may perform similar to the loop filter 300 in FIG. 3 as shown in the graph 400 of FIG. 4.

Figure 7:
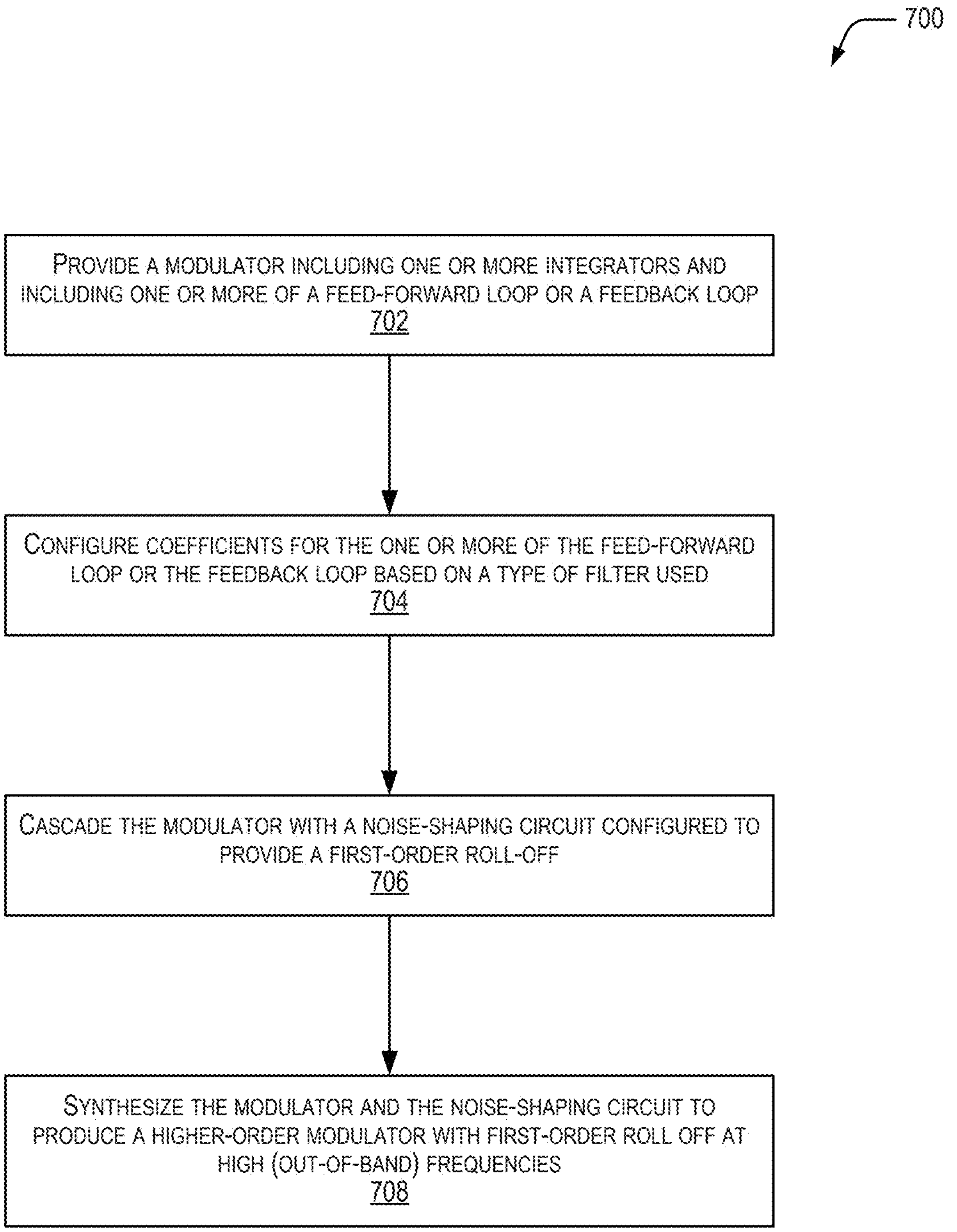
FIG. 7 depicts a flow diagram of a method of synthesizing a modulator with first-order roll-off, in accordance with certain embodiments.

FIG. 7 depicts a flow diagram of a method 700 of synthesizing a modulator with first-order roll-off, in accordance with certain embodiments. At 702, the method 700 may include providing a modulator including one or more integrators and including one or more of a feed-forward loop or a feedback loop. The modulator may be a delta-sigma modulator or a loop filter, such as the CIFF loop filter 300 of FIG. 3. The modulator may be of any order.

At 704, the method 700 may include configuring coefficients for the one or more of the feed-forward loop or the feedback loop based on a type of filter used. In one or more embodiments, the coefficients may be determined based on whether the filters selected by a design tool include a Butterworth filter, a Chebyshev filter, or an inverse Chebyshev filter.

At 706, the method 700 may include cascading the modulator with a noise-shaping circuit to produce a higher-order modulator with first-order roll-off at high (out-of-band) frequencies. In one or more embodiments, the noise-shaping circuit may include a first-order noise-shaped analog-to-digital converter (ADC). In one or more embodiments, the ADC 152 may be combined with a noise-shaping circuit 302 including a transfer function 312 configured to provide the first-order roll-off in the signal transfer function.

At 708, the method 700 may include synthesizing the modulator and the noise-shaping circuit to produce a higher-order modulator with first-order roll off at high frequencies. In one or more embodiments, the design may be synthesized using mathematical modeling software (such as Matlab) or circuit design software (such as Spice or other circuit design software) using a delta-sigma toolbox. The resulting synthesized circuit design may be a discrete-time modulator or a continuous-time modulator. An example of a method of synthesizing a CTDSM is described below with respect to FIG. 8.

Figure 8:
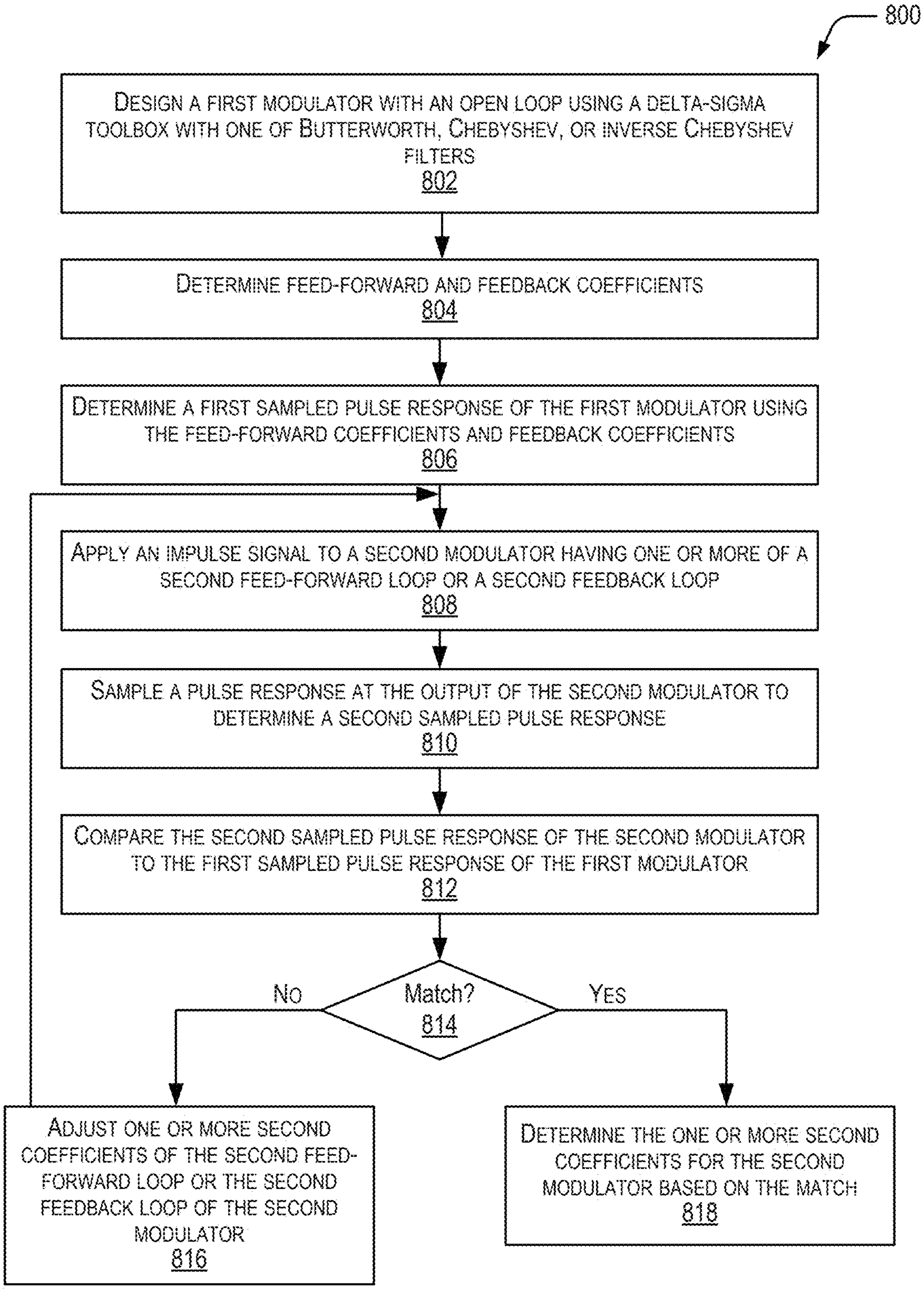
FIG. 8 depicts a flow diagram of a method of determining coefficients of a fifth-order CTDSM based on the loop filters of FIGS. 6A and 6B.

FIG. 8 depicts a flow diagram of a method 800 of determining coefficients of a fifth-order CTDSM based on the loop filters of FIGS. 6A and 6B. At 802, the method 800 may include designing a first modulator with an open loop using a delta-sigma toolbox with one of Butterworth, Chebyshev, or inverse Chebyshev filters. In an example, the designer may select one of the available filters from the delta-sigma toolbox of modeling software to configure the loop filter 600.

At 804, the method 800 may include determining feed-forward coefficients and feedback coefficients. In one or more embodiments, the feedforward coefficients C1, C2, C3, and C4 are determined based on the selected filters. The feedback coefficients d1 and d2 may be determined based on a selected resonance. In one or more embodiments, the method 800 may include determining one or more coefficients for one or more of a feed-forward loop or a feed-back loop.

At 806, the method 800 may include determining a first sampled pulse response of the first modulator using the feed-forward coefficients. In one or more embodiments, a pulse signal is applied to the input 102 of the hybrid loop filter 600, and the pulse response at the output is sampled at a rate determined by a sampling frequency signal $f_s$ to determine a first sampled pulse response.

At 808, the method 800 may include applying an impulse signal to a second modulator having one or more of a second feed-forward loop or a second feedback loop. In an example, an impulse signal may be applied to the input 102 of the fifth-order CTDSM 620 in FIG. 6B.

At 810, the method 800 may include sampling a pulse response at the output of the second modulator to determine a second sampled pulse response. In an embodiment, the sampled pulse response may be determined at the output of the switch 606 of the fifth-order CTDSM 620 in FIG. 620.

At 812, the method 800 may include comparing the second sampled pulse response of the second modulator to the first sampled pulse response of the first modulator. In one or more embodiments, the method 800 may determine if the second sampled pulse response matches the first sampled pulse response.

At 814, if the first and second sampled pulse responses do not match, the method 800 may include adjusting one or more second coefficients of the second feed-forward loop or the second feedback loop of the second modulator, at 816. The method 800 may then return to 808 and apply an impulse signal to the second modulator.

Otherwise, at 814, if the first and second sampled pulse responses match, the method 800 may include determining the one or more second coefficients for the second modulator based on the match, at 818. The one or more second coefficients may include feed-forward loop coefficients, feedback loop coefficients, or any combination thereof to provide the selected signal transfer function. In one or more embodiments, when the selected coefficients of the CTDSM 620 cause the second sampled pulse response to match the first sampled pulse response of the loop filter 600, the coefficients may configure the CTDSM 620 to provide a first-order roll-off at high out-of-band frequencies.

The CTDSM 620 with the coefficients configured to provide a matched sampled pulse response may be configured to provide a first order roll-off at high frequencies, which may achieve higher in-band quantization noise suppression compared to the conventional filters. The first-order roll-off as described above may be used to produce a discrete-time delta-sigma modulator or a CTDSM, which may provide an improved SQNR (as much as 9 dB for a fifth-order CTDSM with a two-bit quantizer and an oversampling rate (OSR) of 25. In one or more embodiments, the CTDSM may provide a first-order roll-off at high frequencies, as shown in FIG. 4, as compared to a flat out-of-band PSD at high frequencies as shown in FIG. 2.

While the above-examples were directed to higher-order delta-sigma modulators and loop filters with four or more integrators, it should be understood that the fourth-order loop filters and the CIFF implementations represent a particular embodiment. However, the methods may be utilized with any order of loop filter. The noise transfer function roll-off is first order at high frequencies ($f_s/2$) instead of at zero-order. The noise transfer function roll-off may be designed and implemented for any order loop filter or delta-sigma modulator, for continuous-time implementations, or for discrete time implementations.

In conjunction with the circuits and methods described above with respect to FIGS. 3-8, a circuit is disclosed that may provide a selected signal transfer function with a first-order roll-off at high frequencies. In one or more embodiments, the circuit may include a fourth-order CIFF loop filter cascaded with a noise-shaped ADC to provide a first-order roll-off at high frequencies. In one or more embodiments, the circuit may include a fifth-order CTDSM having feed-forward coefficients that have a sampled pulse response that matches that of a fourth-order open-loop CIFF, providing a first-order roll-off at high out-of-band frequencies. In one or more embodiments, a circuit may include first modulator that may include a feedback loop, a feed-forward loop, or any combination thereof. The circuit may include a noise-shaping circuit having a noise transfer function coupled to an output of the first modulator. Coefficients of one or more of the feedback loop or the feed-forward loop may be configured in conjunction with the noise transfer function to provide a higher-order modulator with first-order roll-off at high (out-of-band) frequencies. The disclosure may be further understood in light of the following examples.

Example 1: A method may include providing a first modulator including one or more integrators arranged in series and including one or more of a feed-forward loop or a feedback loop; determining coefficients for the one or more of the feed-forward loop or the feedback loop; configuring the one or more of the feed-forward loop or the feedback loop with the determined coefficients; and determining a higher-order modulator with a first-order roll-off based, at least in part, on the determined coefficients.

Example 2: The method of Example 1, where determining the higher-order modulator comprises configuring a noise-shaping circuit coupled to an output of the first modulator to provide first-order noise-shaping.

Example 3: The method of Example 2, where the noise-shaping circuit includes a noise-transfer function that is configurable to provide a selected first-order roll-off.

Example 4: The method of Example 2, where the higher-order modulator comprises a discrete-time delta-sigma modulator.

Example 5: The method of any of Examples 1-4, where determining the higher-order modulator comprises configuring a noise transfer function of a quantizer coupled to an output of the first modulator to provide first-order noise-shaping.

Example 6: The method of Example 1, where determining the higher-order modulator may include applying a signal to an input of the first modulator; and sampling an output of the first modulator to determine a first sampled pulse response.

Example 7: The method of Example 6, further includes providing the higher-order modulator including one or more of a second feed-forward loop or a second feedback loop; applying a signal to an input of the higher-order modulator; sampling an output of the higher-order modulator to determine a second sampled pulse response; and comparing the second sampled pulse response to the first sampled pulse response to determine a match.

Example 8: The method Example 7, where, in response to determining the second sampled pulse response does not match the first sampled pulse response, the method may include adjusting one or more second coefficients of the one or more of the second feed-forward loop or the second feedback loop; and repeating the applying, the sampling to determine the second sampled pulse response, and the comparing to determine the match.

Example 9: The method of any of Examples 7 or 8, where, in response to determining the match, the method may include determining the second coefficients of the one or more of the second feed-forward loop or the second feedback loop that produced the match between the first and second sampled pulse responses; and configuring the higher-order modulator based on the second coefficients to provide the first-order roll-off.

Example 10: The method of any of Examples 1-9, where the higher-order modulator comprises one of a discrete-time delta-sigma modulator (DTDSM) or a continuous-time delta-sigma modulator (CTDSM).

Example 11: The method of any of Examples 1-10, where the first-order roll-off is configurable to improve a signal-to-quantization-noise-ratio for a given sampling frequency and bandwidth.

Example 12: The method of any of Examples 1-10, where the first-order roll-off is configurable to enable a selected sampling frequency for a target signal-to-quantization-noise-ratio and bandwidth.

Example 13: The method of any of Examples 1-12, further including synthesizing the higher-order modulator using a circuit design application.

Example 14: A modulator circuit may include a first modulator including an input and a first output, and including a one or more of a feed-forward loop or a feedback loop; an output circuit including an input coupled to the first output and including an output, the output circuit including one of a noise-shaping circuit, a noise-shaped quantizer circuit, or a fifth integrator and feed-forward component; and where a transfer function of the output circuit and coefficients of the one or more of the feed-forward loop or the feedback loop provide a first-order roll-off at high out-of-band frequencies to provide a higher-order modulator.

Example 15: The modulator circuit of Example 14, where the output circuit may include an analog-to-digital converter (ADC) including an ADC input coupled to the first output and including an ADC output; a feedback circuit including a feedback input coupled to the ADC output and including a feedback output coupled to the ADC input, the feedback circuit including the noise transfer function; and where the coefficients of the one or more of the feed-forward loop or the feedback loop and the noise transfer function of the feedback circuit of the output circuit provide the higher-order modulator with the first order roll-off.

Example 16: The modulator circuit of any of Examples 15 or 16, where the coefficients are selected based on a type of filter used in the first modulator, the type of filter selected from one of a Butterworth filter, a Chebyshev filter, or an inverse Chebyshev filter.

Example 17: The modulator circuit of Example 14, where the output circuit may include an integrator including an integrator input coupled to the first output and including an integrator output; a feed-forward component between the integrator output and the output of the output circuit; and where the coefficients of the one or more of the feed-forward loop or the feedback loop of the first modulator and a coefficient of the feed-forward component of the output circuit provide the higher-order modulator with the first-order roll-off.

Example 18: The modulator circuit of Example 17, where the coefficients of the one or more of the feed-forward loop or the feedback loop of the first modulator and the coefficient of the feed-forward component of the output circuit are selected by matching a pulse signal response at the output to a second pulse impulse response of the first modulator without the output circuit.

Example 19: The modulator circuit of any of Examples 14-18, where the first-order roll-off is configurable to improve a signal-to-quantization-noise-ratio for a given sampling frequency and bandwidth.

Example 20: The modulator circuit of any of Examples 14-18, where the first-order roll-off is configurable to enable a selected sampling frequency for a target signal-to-quantization-noise-ratio and bandwidth.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims.

What is claimed is:

1. A method comprises:
- providing a first modulator including one or more integrators arranged in series and including one or more of a feed-forward loop or a feedback loop;
- determining coefficients for the one or more of the feed-forward loop or the feedback loop;
- configuring the one or more of the feed-forward loop or the feedback loop with the determined coefficients;
- determining a higher-order modulator with a first-order roll-off based, at least in part, on the determined coefficients;
- determining a first sampled pulse response at an output of the first modulator based on a signal applied to an input of the first modulator;
- providing the higher-order modulator including one or more of a second feed-forward loop or a second feedback loop;
- applying a signal to an input of the higher-order modulator;
- sampling an output of the higher-order modulator to determine a second sampled pulse response; and
- comparing the second sampled pulse response to the first sampled pulse response to determine a match.

2. The method of claim 1, wherein determining the higher-order modulator comprises configuring a noise-shaping circuit coupled to an output of the first modulator to provide first-order noise-shaping.

3. The method of claim 2, wherein the noise-shaping circuit includes a noise-transfer function that is configurable to provide a selected first-order roll-off.

4. The method of claim 2, wherein the higher-order modulator comprises a discrete- time delta-sigma modulator.

5. The method of claim 1, wherein determining the higher-order modulator comprises configuring a noise transfer function of a quantizer coupled to an output of the first modulator to provide first-order noise-shaping.

6. The method claim 1, wherein, in response to determining the second sampled pulse response does not match the first sampled pulse response, the method comprises:
- adjusting one or more second coefficients of the one or more of the second feed-forward loop or the second feedback loop; and
- repeating the applying, the sampling to determine the second sampled pulse response, and the comparing to determine the match.

7. The method of claim 1, wherein, in response to determining the match, the method comprises:
- determining second coefficients of the one or more of the second feed-forward loop or the second feedback loop that produced the match between the first and second sampled pulse responses; and
- configuring the higher-order modulator based on the second coefficients to provide the first-order roll-off.

8. The method of claim 1, wherein the higher-order modulator comprises one of a discrete-time delta-sigma modulator (DTDSM) or a continuous-time delta-sigma modulator (CTDSM) having a selected order.

9. The method of claim 1, wherein the first-order roll-off is configurable to improve a signal-to-quantization-noise-ratio for a given sampling frequency and bandwidth.

10. The method of claim 1, wherein the first-order roll-off is configurable to enable a selected sampling frequency for a target signal-to-quantization-noise-ratio and bandwidth.

11. The method of claim 1, further comprising synthesizing the higher-order modulator using a circuit design application.

12. A modulator circuit comprises:
- a first modulator including an input and a first output and including one or more of a feed-forward loop or a feedback loop;
- an output circuit including an input coupled to the first output and including an output, the output circuit including one of a noise-shaping circuit, a noise-shaped quantizer circuit, or a fifth integrator and feed-forward component, the output circuit comprising:
  - an integrator including an integrator input coupled to the first output and including an integrator output;
  - a feed-forward component between the integrator output and the output of the output circuit; and
- wherein a transfer function of the output circuit and coefficients of the one or more of the feed-forward loop or the feedback loop provide a first-order roll-off at high out-of-band frequencies to provide a higher-order modulator; and
- wherein coefficients of the one or more of the feed-forward loop or the feedback loop of the first modulator and a coefficient of the feed-forward component of the output circuit provide the higher-order modulator with the first-order roll-off.

13. The modulator circuit of claim 12, wherein the output circuit comprises:
- an analog-to-digital converter (ADC) including an ADC input coupled to the first output and including an ADC output;
- a feedback circuit including a feedback input coupled to the ADC output and including a feedback output coupled to the ADC input, the feedback circuit including the noise transfer function; and
- wherein coefficients of the one or more of the feed-forward loop or the feedback loop and the noise transfer function of the feedback circuit of the feedback circuit of the output circuit provide the higher-order modulator with the first order roll-off.

14. The modulator circuit of claim 12, wherein the coefficients are selected based on a type of filter used in the first modulator, the type of filter selected from one of a Butterworth filter, a Chebyshev filter, or an inverse Chebyshev filter.

15. The modulator circuit of claim 12, wherein the coefficients of the one or more feed-forward loop or the feedback loop of the first modulator and the coefficient of the feed-forward component of the output circuit are selected by matching a pulse signal response at the output to a second pulse signal response of the first modulator without the output circuit.

16. The modulator circuit of claim 12, wherein the first-order roll-off is configurable to improve a signal-to-quantization-noise-ratio for a given sampling frequency and bandwidth.

17. The modulator circuit of claim 12, wherein the first-order roll-off is configurable to enable a selected sampling frequency for a target signal-to-quantization-noise-ratio and bandwidth.

* * * * *